(12) United States Patent
Kuriyama et al.

(10) Patent No.: US 7,548,666 B2
(45) Date of Patent: Jun. 16, 2009

(54) SOLID STATE IMAGING DEVICE AND METHOD FOR MANUFACTURING THE SAME

(75) Inventors: Toshihiro Kuriyama, Shiga (JP); Atsushi Tomozawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/582,984

(22) Filed: Oct. 19, 2006

(65) Prior Publication Data

US 2007/0170477 A1    Jul. 26, 2007

(30) Foreign Application Priority Data

Jan. 25, 2006    (JP)    ............... 2006-016054

(51) Int. Cl.
*G02B 6/12* (2006.01)

(52) U.S. Cl. ....................................................... 385/14
(58) Field of Classification Search .................... 385/14
See application file for complete search history.

(56) References Cited

U.S. PATENT DOCUMENTS

2006/0115230 A1* 6/2006 Komoguchi et al. ........ 385/146

2007/0040102 A1* 2/2007 Mouli ...................... 250/214.1

FOREIGN PATENT DOCUMENTS

JP    11-121725 A    4/1999

* cited by examiner

*Primary Examiner*—Uyen Chau N Le
*Assistant Examiner*—Hoang Tran
(74) *Attorney, Agent, or Firm*—McDermott Will & Emery LLP

(57) ABSTRACT

A plurality of light receiving elements are arranged in a matrix with uniform space therebetween in a light receiving region defined on a semiconductor substrate. A plurality of read-out electrodes are formed on the semiconductor substrate in an arrangement corresponding to the light receiving elements to read charges generated by the light receiving elements, a light shield film having openings positioned above the light receiving elements is formed to cover the read-out electrodes, first optical waveguides are formed in the openings above the light receiving elements and second optical waveguides are formed on the light shield film. The second optical waveguides are in the form of dots, stripes or a grid when viewed in plan.

5 Claims, 9 Drawing Sheets

SOLID STATE IMAGING DEVICE AND METHOD FOR MANUFACTURING THE SAME

BACKGROUND OF THE INVENTION

1. Field of the Invention

The present invention relates to a solid state imaging device and a method for manufacturing the same. In particular, it relates to a solid state imaging device including a plurality of light receiving elements arranged in a matrix and a method for manufacturing the same.

2. Description of Related Art

In recent years, there has been an increasing demand for solid state imaging devices as imaging devices for digital still cameras and video cameras. Further, in the field of mobile devices such as cellular phones, camera-equipped ones are highly demanded. From this aspect, the demand for the solid state imaging devices has been expanding. Aiming at higher quality images, the number of pixels tends to increase year after year. As the increase in pixel count involves the need of decreasing pixel area, further improvement in light gathering power has been demanded.

Now, referring to FIGS. 7 to 9, explanation of a conventional solid state imaging device is provided. FIG. 7 is a plan view schematically illustrating the structure of a conventional CCD (charge coupled device) solid state imaging device. As shown in FIG. 7, the CCD solid state imaging device includes a semiconductor substrate 201 on which a plurality of light receiving elements 202 are provided in a two-dimensional arrangement. Further, vertical transfer portions (vertical CCDs) 203 are provided between the vertical columns of the light receiving elements 202 and a horizontal transfer portion (horizontal CCD) 204 is provided adjacent to the endmost line of the light receiving elements 202. The light receiving elements 202 are photodiodes and accumulate charges corresponding to the intensity of light received. A single light receiving element 202 and part of the vertical CCD 203 adjacent thereto constitute a single pixel 206.

As indicated by an arrow in FIG. 7, the charges accumulated in the light receiving elements 202 are read out and transferred in the vertical direction by the vertical CCDs 203. The charges transferred by the vertical CCDs 203 are then transferred in the horizontal direction by the horizontal CCD 204, amplified by an amplifier 205 and then externally output.

In order to improve the light gathering power of the light receiving elements 202, a combination of a microlens and an optical waveguide is provided on each of the light receiving elements 202. Hereinafter, explanation of the CCD solid state imaging device is provided with reference to FIGS. 8 and 9. FIG. 8 is a plan view illustrating an enlargement of part of the conventional solid state imaging device provided with the microlenses and the optical waveguides and FIG. 9 is a sectional view taken along the line IX-IX shown in FIG. 8.

In the CCD solid state imaging device, as shown in FIG. 8, vertical CCDs 103, openings 107, optical waveguides 108 and on-chip microlenses 109 are provided on a semiconductor substrate 111. The vertical CCDs 103, openings 107, optical waveguides 108 and on-chip microlenses 109 constitute unit cells 106. As shown in FIG. 9, charge transfer portions 114 and photodiodes 115 are also formed in the semiconductor substrate 111. The surface of the semiconductor substrate 111 is covered with a gate insulating film 112 and gate electrodes 113 are formed on the gate insulating film 112. An interlayer insulating film 116 is formed on the gate electrodes 113 and a light shield film 117 is formed thereon to cover the gate insulating film 112 and the interlayer insulating film 116. The openings 107 are formed in the light shield film 117.

An insulating film 118 is formed on the light shield film 117 and in the openings 107. The optical waveguides 108 are formed in the openings 107. On the insulating film 118 and the optical waveguides 108, a planarization film 121 is formed with a passivation film 126 interposed therebetween. A color filter 122 is formed on the planarization film 121 and the on-chip microlenses 109 are formed on the color filter 122 to be positioned above the photodiodes 115.

As described above, the CCD solid state imaging device shown in FIG. 9 includes the on-chip microlenses 109 formed at the topmost surface and the optical waveguides 108 formed in the insulating film 118. As the optical waveguides 108 and the microlenses 109 are provided at positions corresponding to the photodiodes 115, the light gathering power of the photodiodes 115 improves to a further extent (see Japanese Unexamined Patent Publication No. H11-121725 (page 7, FIG. 1)).

SUMMARY OF THE INVENTION

Although the CCD solid state imaging device shown in FIG. 9 improves in sensitivity to light, there has been a problem still unsolved. Specifically, light incident obliquely on the CCD solid state imaging device (hereinafter referred to as oblique light) and light coming through a gap between adjacent microlenses (hereinafter referred to as a lens gap) enter adjacent pixels other than the target pixel, thereby causing color mixing.

Thus, the pixels of the CCD solid state imaging device still vary in sensitivity to light. Explanation is provided below in detail with reference to FIG. 9.

Various kinds of light enter a pixel, for example, light La coming through the microlens 109 corresponding to the pixel, light Lb coming through the lens gap and light Lc coming through the microlens 109 corresponding to an adjacent pixel. Almost all of the light La that passed through the corresponding microlens 109 is guided to the light receiving element in the same pixel. However, as to the light Lb coming through the lens gap and the light Lc coming through the adjacent pixel, part of which may enter the certain pixel and the other may enter the adjacent pixels. The amount of unwanted incident light varies in response to the properties of a camera lens for projecting light onto the imaging device and variations caused in the process of manufacturing the solid state image device.

Under these circumstances, the present invention has been achieved. An object of the present invention is to provide a CCD solid state imaging device which makes it possible to prevent color mixing due to the entrance of oblique light and light coming through the lens gap and to reduce the variations in sensitivity to light between the pixels.

A solid state imaging device according to a first aspect of the present invention includes a plurality of light receiving elements arranged in a substrate and includes first optical waveguides formed above the light receiving elements and second optical waveguides formed above regions between the light receiving elements.

In the solid state imaging device according to a first aspect of the present invention, the second optical waveguides are formed in addition to the first optical waveguides. With this structure, light coming through the lens gap and oblique light are confined in the second optical waveguides. This makes it possible to attenuate the intensities of the lights and prevent the entrance of them into pixels adjacent to the target pixel. As a result, color mixing is prevented and the pixels are less likely to vary in sensitivity to light.

The solid state imaging device according to the first aspect of the present invention may further include condenser lenses provided in the same arrangement as the light receiving elements and the first optical waveguides when viewed in plan, wherein the second optical waveguides may be positioned below regions between the condenser lenses.

The solid state imaging device according to the first aspect of the present invention may further include light absorbers arranged below the second optical waveguides.

As to the solid state imaging device according to the first aspect of the present invention, the second optical waveguides may be column-shaped.

As to the solid state imaging device according to the first aspect of the present invention, the second optical waveguides may be in the form of a grid or stripes when viewed in plan.

The solid state imaging device according to the first aspect of the present invention may further include charge transfer portions formed in the substrate to be positioned between the light receiving elements; a gate insulating film formed on the charge transfer portions; gate electrodes formed on the gate insulating film; a light shield film covering the gate electrodes and having openings positioned above the light receiving elements; and an insulating film covering the surface of the light shield film and the inside of the openings, wherein the first optical waveguides may be formed in the openings and the second optical waveguides may be formed above the light shield film.

A method for manufacturing the solid state imaging device according to the first aspect of the present invention is a method for manufacturing a solid state imaging device including a plurality of light receiving elements arranged in a substrate, the method comprising the steps of: (a) depositing a first insulating film above the substrate in which the light receiving elements have been formed; (b) forming first openings in the first insulating film to be positioned above the light receiving elements; (c) forming second openings in the first insulating film to be positioned above regions between the light receiving elements; and (d) filling the first openings and the second openings with a second insulating film to form first optical waveguides in the first openings and second optical waveguides in the second openings.

By the method according to the first aspect of the present invention, the second optical waveguides are formed in addition to the first optical waveguides. In the solid state imaging device manufactured by the method, light coming through the lens gap and oblique light are confined in the second optical waveguides. This makes it possible to attenuate the intensities of the lights and prevent the entrance of them into pixels adjacent to the target pixel. Thus, the solid state imaging device prevents color mixing and reduces variations in sensitivity to light between the pixels.

As to the method according to the first aspect of the present invention, a SiN film may be formed by HDP-CVD as the second insulating film in the step (d).

As to the method according to the first aspect of the present invention, in the step (d), the second insulating film may be formed to fill the first openings and the second openings and cover the surface of the first insulating film and then part of the second insulating film positioned above the first insulating film may be removed. In this case, the second insulating film fills both of the first and second openings, thereby reducing the height of protrusions to be generated on the insulating film. This makes the following planarization step easy.

As to the method according to the first aspect of the present invention, the steps (b) and (c) may be performed simultaneously.

DETAILED DESCRIPTION OF THE INVENTION

First Embodiment

Figure 7:
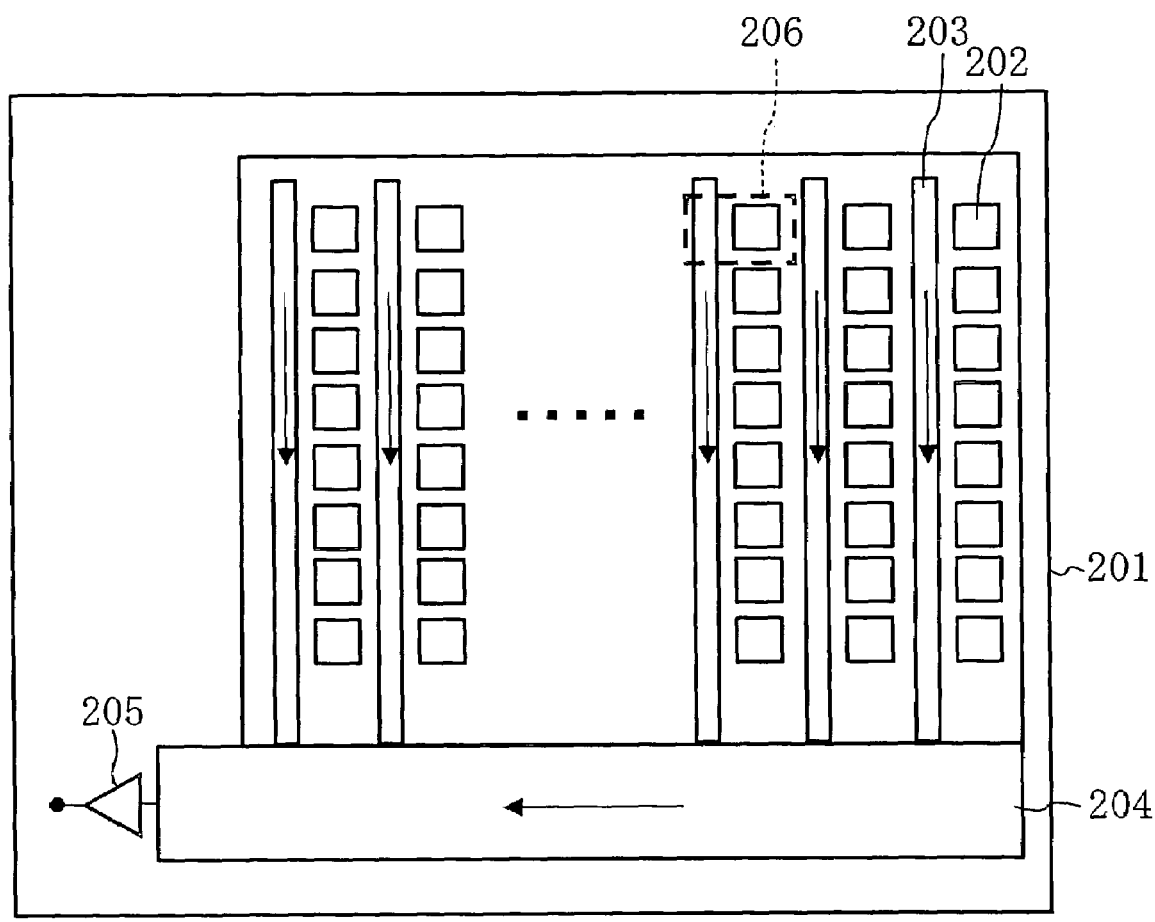
FIG. 7 is a plan view schematically illustrating the structure of a conventional CCD solid state imaging device.

Hereinafter, explanation of a CCD solid state imaging device according to a first embodiment of the present invention is provided with reference to the drawings. As pixels in the CCD solid state imaging device of the present embodiment are provided in the same arrangement as those of the conventional device shown in FIG. 7, detailed explanation and graphic representation thereof are omitted.

Figure 1:
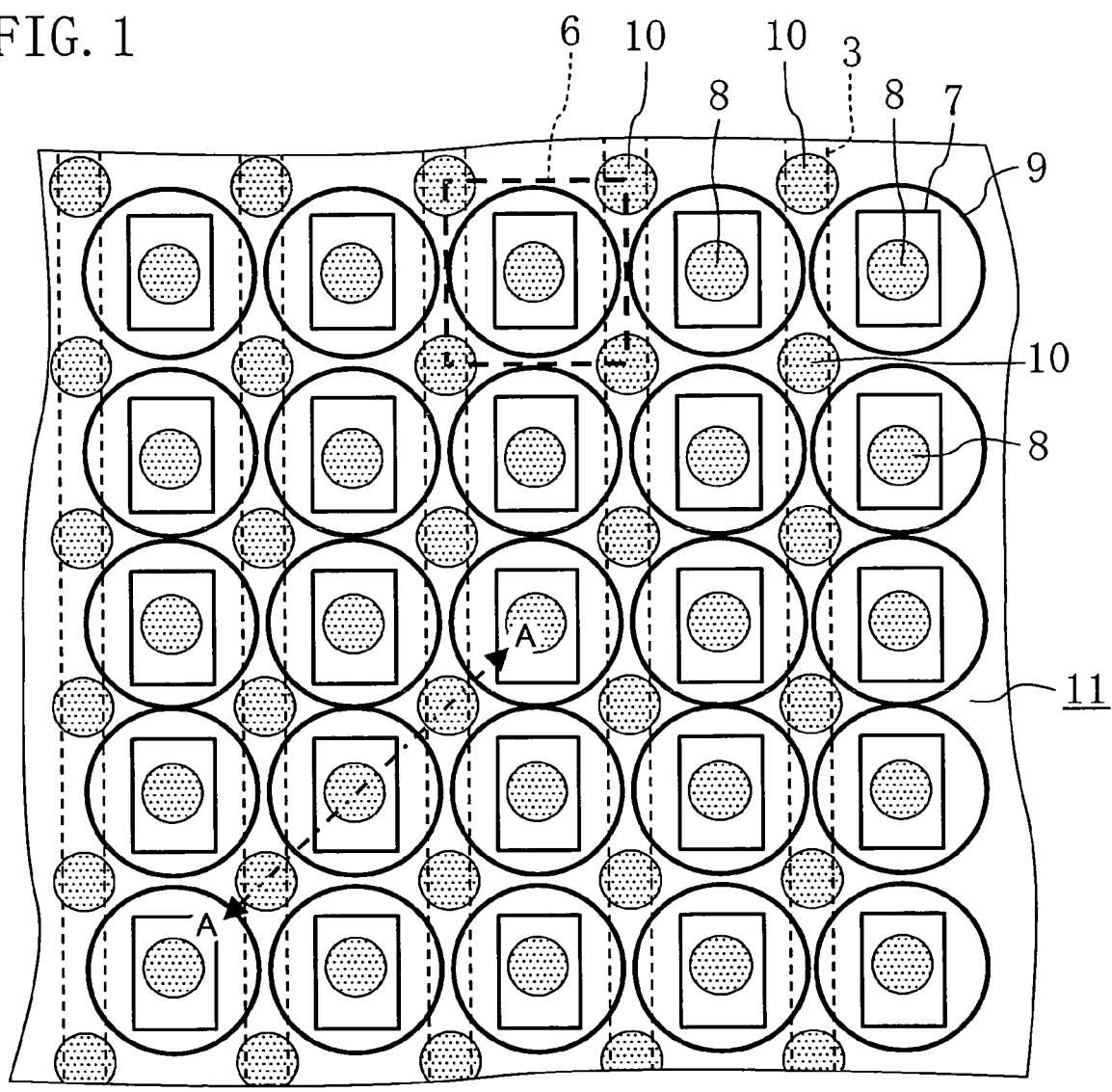
FIG. 1 is a plan view illustrating an enlargement of part of a CCD solid state imaging device according to a first embodiment of the present invention.
Figure 2:
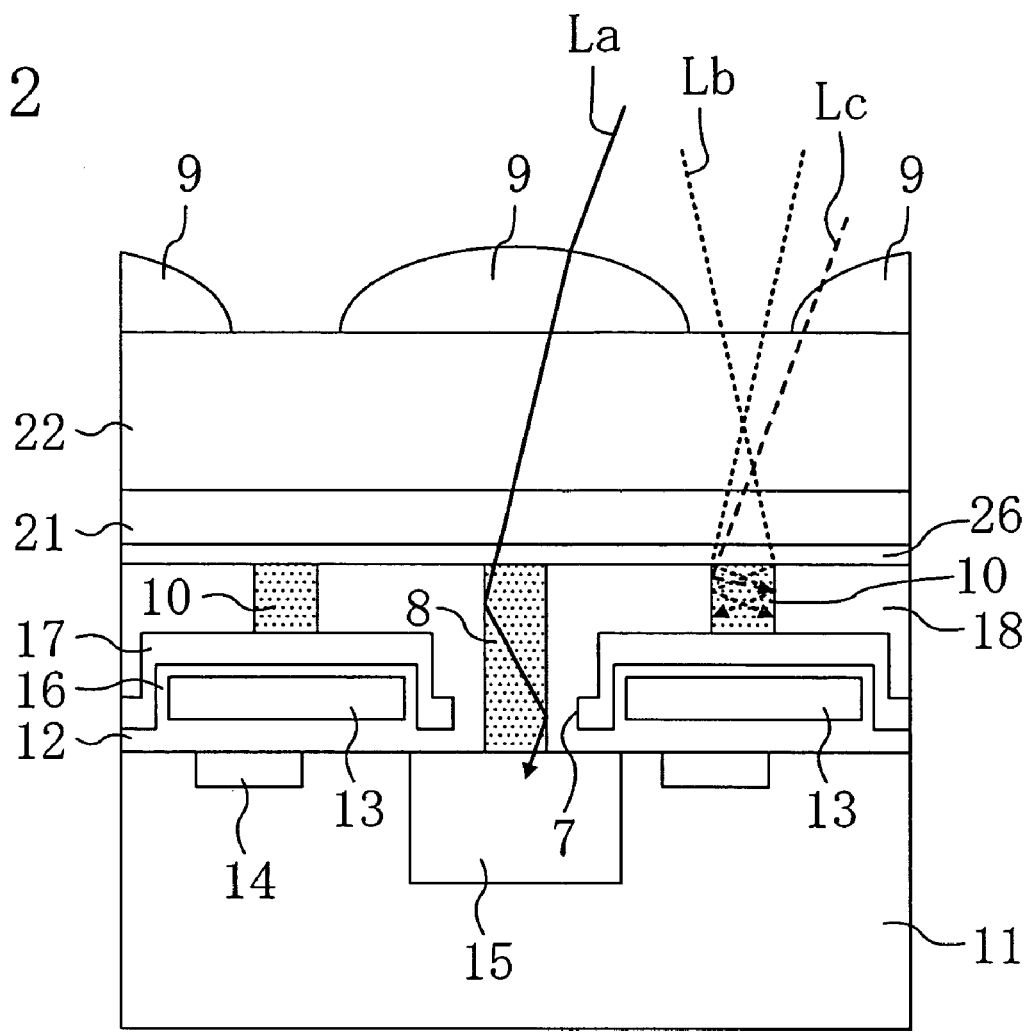
FIG. 2 is a sectional view taken along the line II-II shown in FIG. 1.

FIG. 1 is a plan view illustrating an enlargement of part of the CCD solid state imaging device according to the first embodiment and FIG. 2 is a sectional view taken along the line II-II shown in FIG. 1.

As shown in FIG. 1, the CCD solid state imaging device of the present embodiment includes a semiconductor substrate 11 on which vertical CCDs 3, openings 7 and on-chip microlenses 9 are provided. First optical waveguides 8 are formed in the openings 7 such that each of the first optical waveguides 8 is positioned at the center of the diagonal line of the opening 7. Second optical waveguides 10 are arranged at regions between the microlenses 9 (at the lens gaps). The vertical CCDs 3, openings 7, first and second optical waveguides 8 and 10 and on-chip microlenses 9 constitute unit cells 6.

As shown in FIG. 2, the semiconductor substrate 11 is further provided with charge transfer portions 14 and photodiodes 15. The surface of the semiconductor substrate 11 is covered with a gate insulating film 12 made of a silicon oxide film and gate electrodes 13 made of polysilicon are formed on the gate insulating film 12 to be positioned immediately above the charge transfer portions 14. The gate electrodes 13 read out signal charges generated by the photodiodes 15 to output them to the charge transfer portions 14. On the gate electrodes 13, an interlayer insulating film 16 made of a silicon oxide film is formed and a light shield film 17 is formed to cover the gate insulating film 12 and the interlayer insulating film 16. The light shield film 17 prevents light from entering the gate electrodes 13 and may be made of W (tungsten), for example. Openings 7 are formed in the light shield film 17 in order to let light enter the photodiodes 15. The openings 7 are formed immediately above the photodiodes 15 in a matrix arrangement with uniform space between them.

An insulating film 18 is formed on the light shield film 17 and the photodiodes 15 exposed in the openings 7. The insulating film 18 is optically transparent and may be a BPSG film formed by CVD, for example. In the insulating film 18 which fills the openings 7, first optical waveguides 8 are formed to be positioned above the photodiodes 15. The first optical waveguides 8 are paths to guide light coming from above to the photodiodes 15.

Second optical waveguides 10 are formed on the light shield film 17. The second optical waveguides 10 have a function of guiding part of light coming from above (specifically, light Lb coming through the lens gaps or light Lc coming through microlenses of adjacent pixels) into the second optical waveguides 10 to confine the light therein and attenuate the light intensity.

On the insulating film 18 and the first and second optical waveguides 8 and 10, a planarization film 21 made of a silicon oxide film, a transparent resin film or a stack of them is formed with a passivation film 26 interposed therebetween. The passivation film 26 and the planarization film 21 are optically transparent. A color filter 22 is formed on the planarization film 21 and on-chip microlenses 9 are formed on the color filter 22 in an arrangement corresponding to the photodiodes 15.

As described above, in the solid state imaging device of the present embodiment, the first optical waveguides 8 are formed for the photodiodes 15, respectively, and the second optical waveguides 10 are additionally formed on the light shield film 17. Therefore, the light Lb coming through the lens gaps and the oblique light Lc are confined in the second optical waveguides 10, thereby attenuating the intensities of the lights and preventing the entrance of the lights into adjacent pixels. This makes it possible to prevent color mixing caused by the oblique light and reduce the variations in sensitivity to light between the pixels.

Next, explanation of a method for manufacturing the CCD solid state imaging device of the present embodiment is provided with reference to the drawings. FIGS. 3A to 3E are sectional views illustrating the steps of manufacturing the CCD solid state imaging device according to the first embodiment.

According to the method of the present embodiment, first, photodiodes 15 are formed in the surface of the semiconductor substrate 11 in a matrix arrangement with uniform space between them. Then, charge transfer portions 14 are formed also in the semiconductor substrate 11 such that each of which is positioned next to the photodiode 15 with certain space therebetween. Then, a gate insulating film 12 made of a silicon oxide film is formed on the semiconductor substrate 11 by CVD.

Then, gate electrodes 13 made of polysilicon are formed on the gate insulating film 12 to be positioned immediately above the charge transfer portions 14. Specifically, the gate electrodes 13 are formed by depositing a polysilicon film by CVD and selectively removing a certain part thereof by dry etching. After the formation of the gate electrodes 13, an interlayer insulating film 16 made of a silicon oxide film is formed to cover the gate electrodes 13. The interlayer insulating film 16 is deposited by CVD.

After the deposition of the interlayer insulating film 16, a light shield film 17 is formed to cover the interlayer insulating film 16. Specifically, a thin W film is formed by PVD or CVD to cover the interlayer insulating film 16 and the gate insulating film 12. Thereafter, parts of the thin W film positioned above the photodiodes 15 are selectively removed by dry etching. Thus, the light shield film 17 having openings 7 is obtained. Then, a BPSG film is deposited by CVD on the light shield film 17 and in the openings 7. The BPSG film is then reflowed by heating to planarize its surface. Thus, an insulating film 18 is provided. At this stage, the obtained solid state imaging device has a sectional structure shown in FIG. 3A.

Then, parts of the insulating film 18 positioned above the light shield film 17 and in the openings 7 are selectively removed by dry etching using CF gas to form openings 19 positioned above the light shield film 17 and openings 20 positioned above the photodiodes 15. In the dry etching step, the light shield film 17 formed below the insulating film 18 and made of tungsten functions as an etch stopper. Therefore, both of the openings 19 and 20 are formed in a single drying step.

The selective removal of the insulating film 18 in the openings 7 is preferably carried out such that part of the insulating film 18 contacting the semiconductor substrate 11 is not removed so as not to have damage to the semiconductor substrate 11. At this stage, the CCD solid state imaging device has a sectional structure shown in FIG. 3B.

Then, a nitride film 24 is deposited by HDP (high-density plasma)-CVD to fill the openings 19 and 20 and cover the insulating film 18. In this step, part of the nitride film 24 formed on the insulating film 18 is protruded upward by a height h1 as compared with part of the nitride film 24 positioned above the openings 19 and 20. At this stage, the solid state imaging device has a sectional structure shown in FIG. 3C.

Figure 3A:
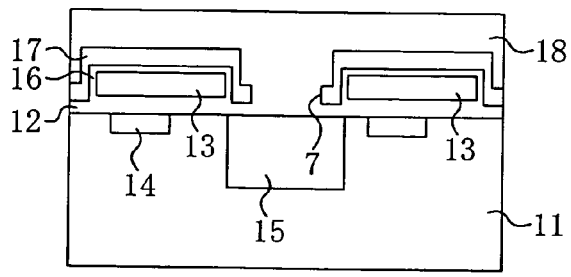
FIGS. 3A to 3E are sectional views illustrating the steps of manufacturing the CCD solid state imaging device according to the first embodiment.
Figure 3D:
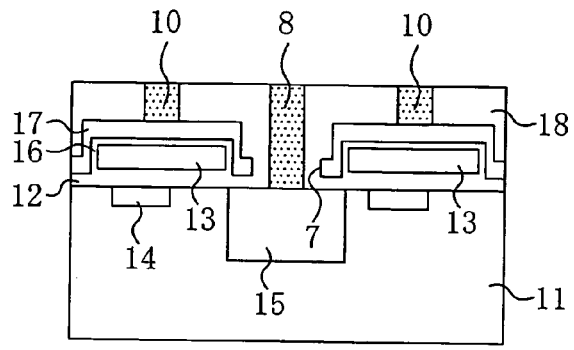
Figure 3B:
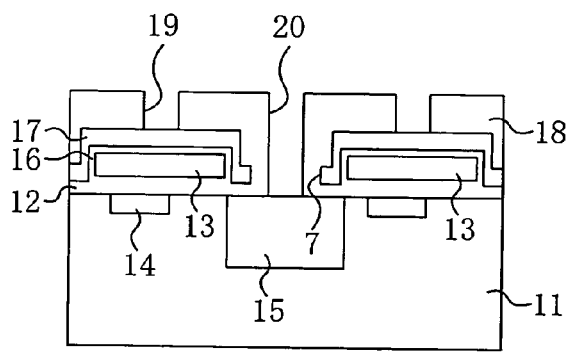
Figure 3E:
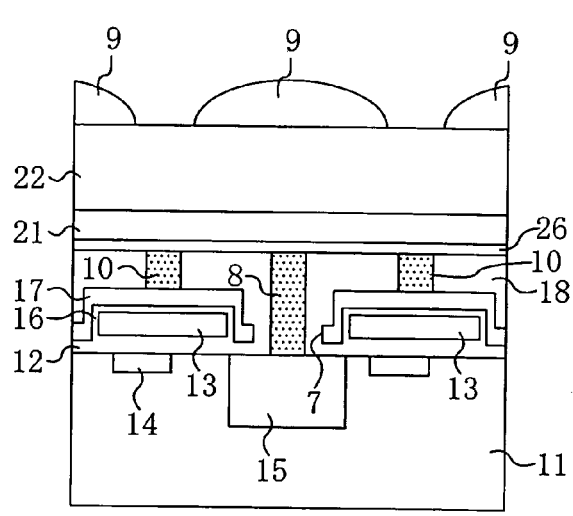
Figure 3C:
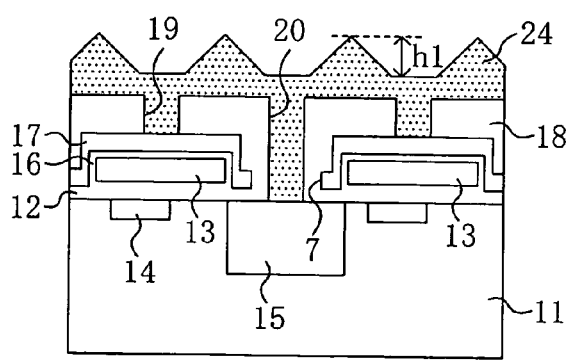
Figure 8:
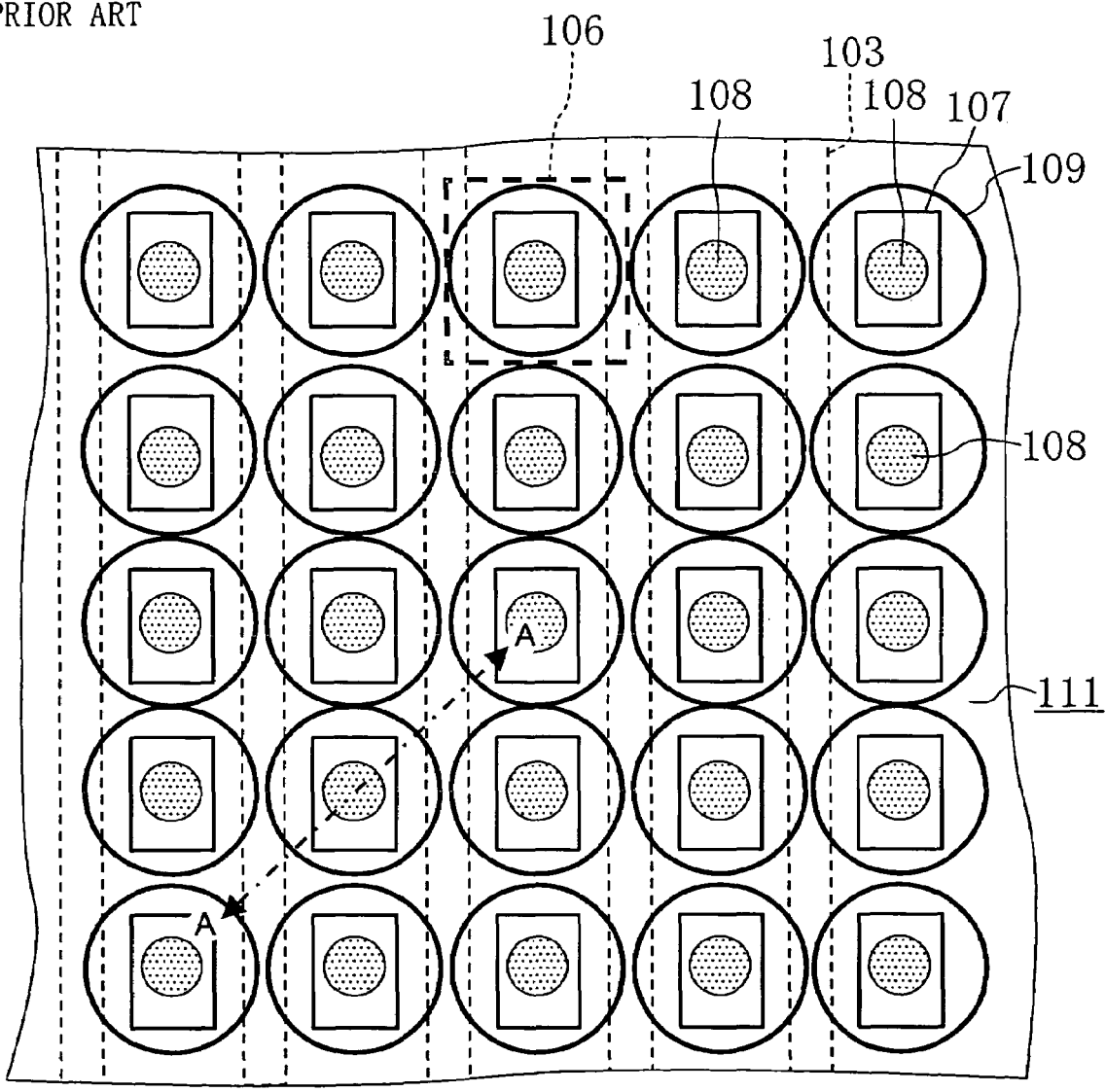
FIG. 8 is a plan view illustrating an enlargement of part of a conventional solid state imaging device including microlenses and optical waveguides.
Figure 9:
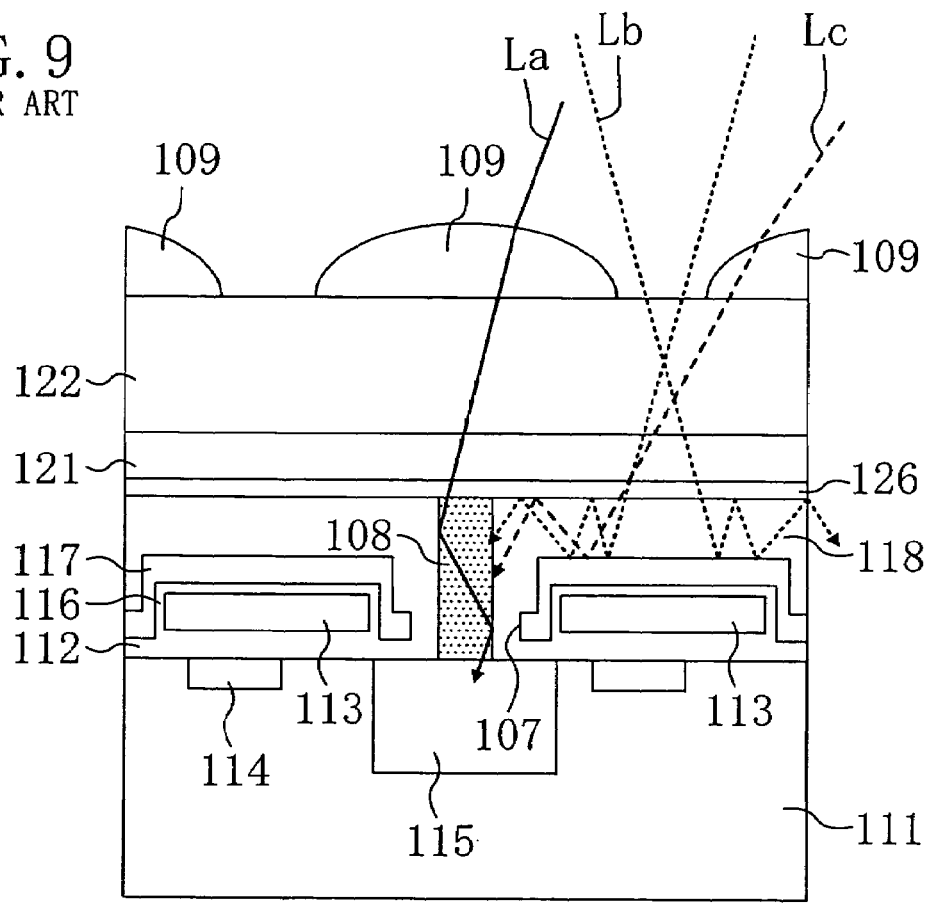
FIG. 9 is a sectional view taken along the line IX-IX shown in FIG. 8.
Figure 10:
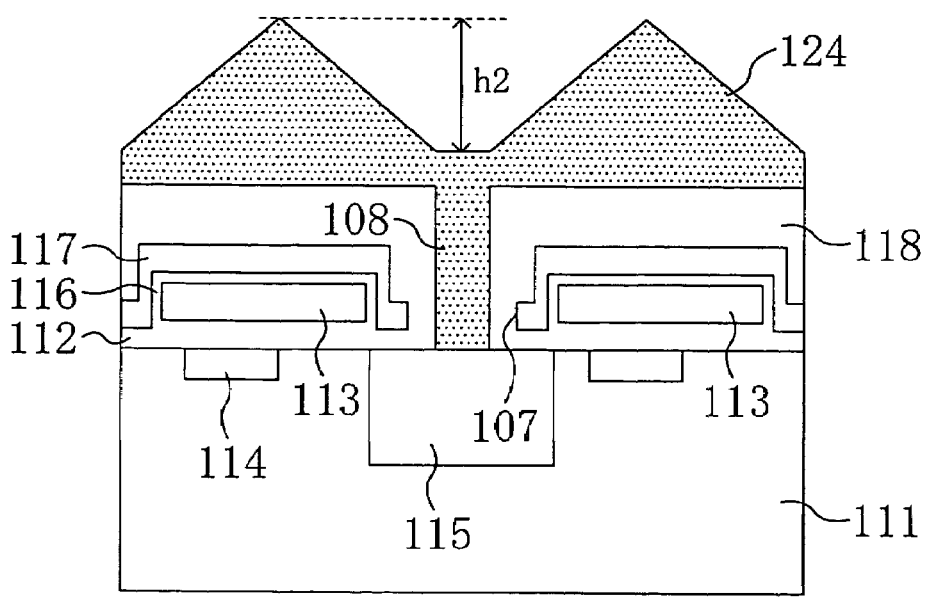
FIG. 10 is a view illustrating protrusions generated during the manufacture of the conventional CCD solid state imaging device.

The height h1 of the protrusion according to the present embodiment is compared with the height of a protrusion generated in a conventional solid state imaging device. FIG. 10 is a view illustrating the protrusion generated during the manufacture of the conventional CCD solid state imaging device shown in FIGS. 8 and 9. As shown in FIG. 3C and FIG. 10, the height h1 of the protrusion of the device of the present embodiment is reduced to ½ or less of the height h2 of the protrusion of the conventional device. The height of the protrusion is in proportion to the distance between adjacent two openings to be filled with the nitride film 24. As the second optical waveguides 10 are provided between the first optical waveguides 8 in the present embodiment, the distance is reduced to ½ or less. This facilitates the following planarization step.

Then, the surface of the nitride film 24 is planarized by CMP or etch-back to provide first and second optical waveguides 8 and 10. At this stage, the solid state imaging device has a sectional structure shown in FIG. 3D.

Then, a passivation film 26 is formed on the insulating film 18 and the first and second optical waveguides 8 and 10. A planarization film 21 is formed on the passivation film 26 and a color filter 22 is formed thereon. Specifically, a three or four layered film is formed according to color coding by dyeing or application of color resist. In the final step, on-chip microlenses 9 are formed on the color filter 22. To be more specific, the on-chip microlenses 9 are provided by forming a thermofusible transparent resin on the color filter 22 and directly heating the resin for reflowing. Alternatively, a resist is formed on the transparent resin and heated for reflowing to form a pattern and the pattern is printed on the transparent resin. Thus, the solid state imaging device configured as shown in FIG. 3E is completed. The second optical waveguides 10 are preferably formed to be positioned below the gaps between the on-chip microlenses 9.

Second Embodiment

Figure 4:
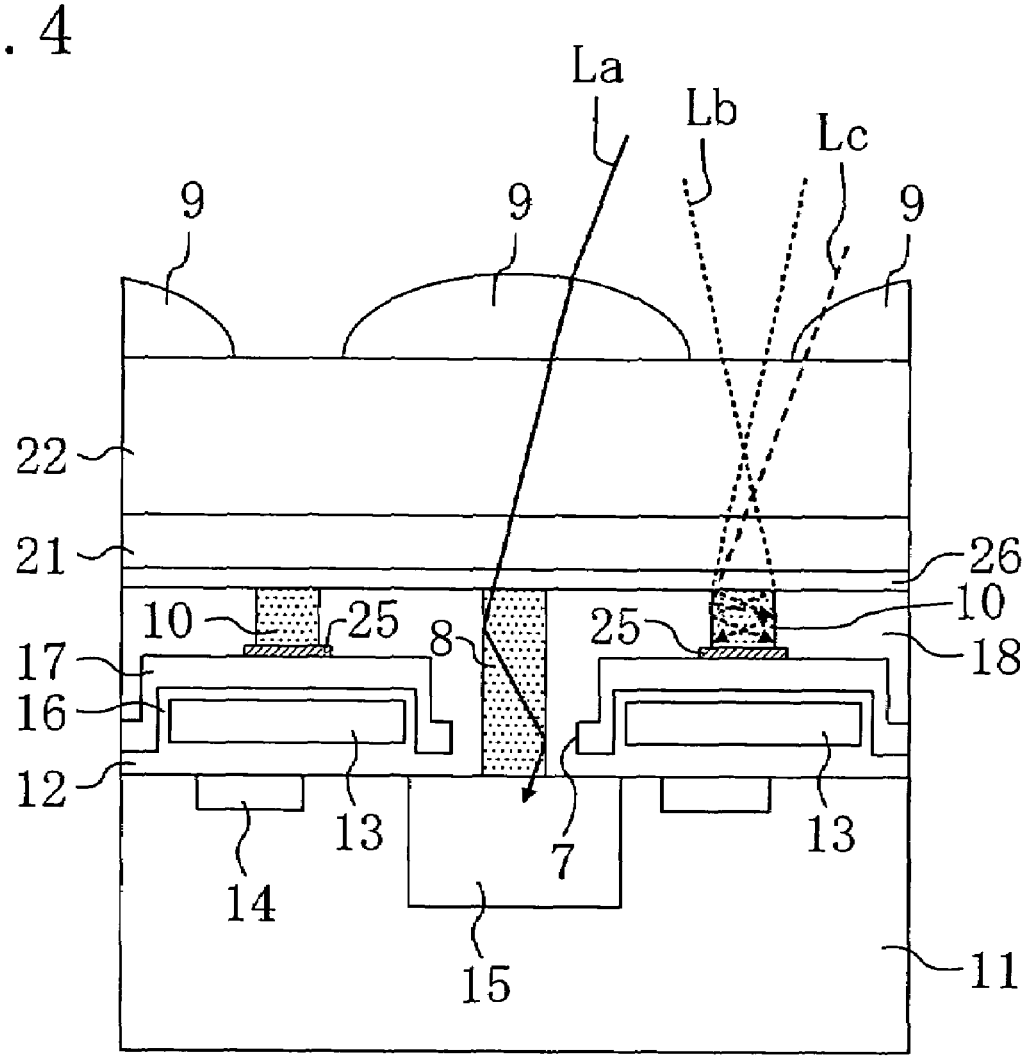
FIG. 4 is a plan view illustrating an enlargement of part of a CCD solid state imaging device according to a second embodiment of the present invention.

FIG. 4 is a plan view illustrating an enlargement of part of a CCD solid state imaging device according to a second embodiment. In the solid state imaging device of the present embodiment, light absorbers 25 are provided below the second optical waveguides 10, i.e., between the second optical waveguides 10 and the light shield film 17. This structure makes it possible to reduce re-reflection of light to a further extent. Other structures and effects of the present embodiment are the same as those of the first embodiment and therefore the explanation is omitted.

Other Embodiments

In the first and second embodiments described above, explanation is made with the CCD solid state imaging device taken as an example. However, the solid state imaging device of the present invention may be a MOS solid state imaging device.

Figure 5:
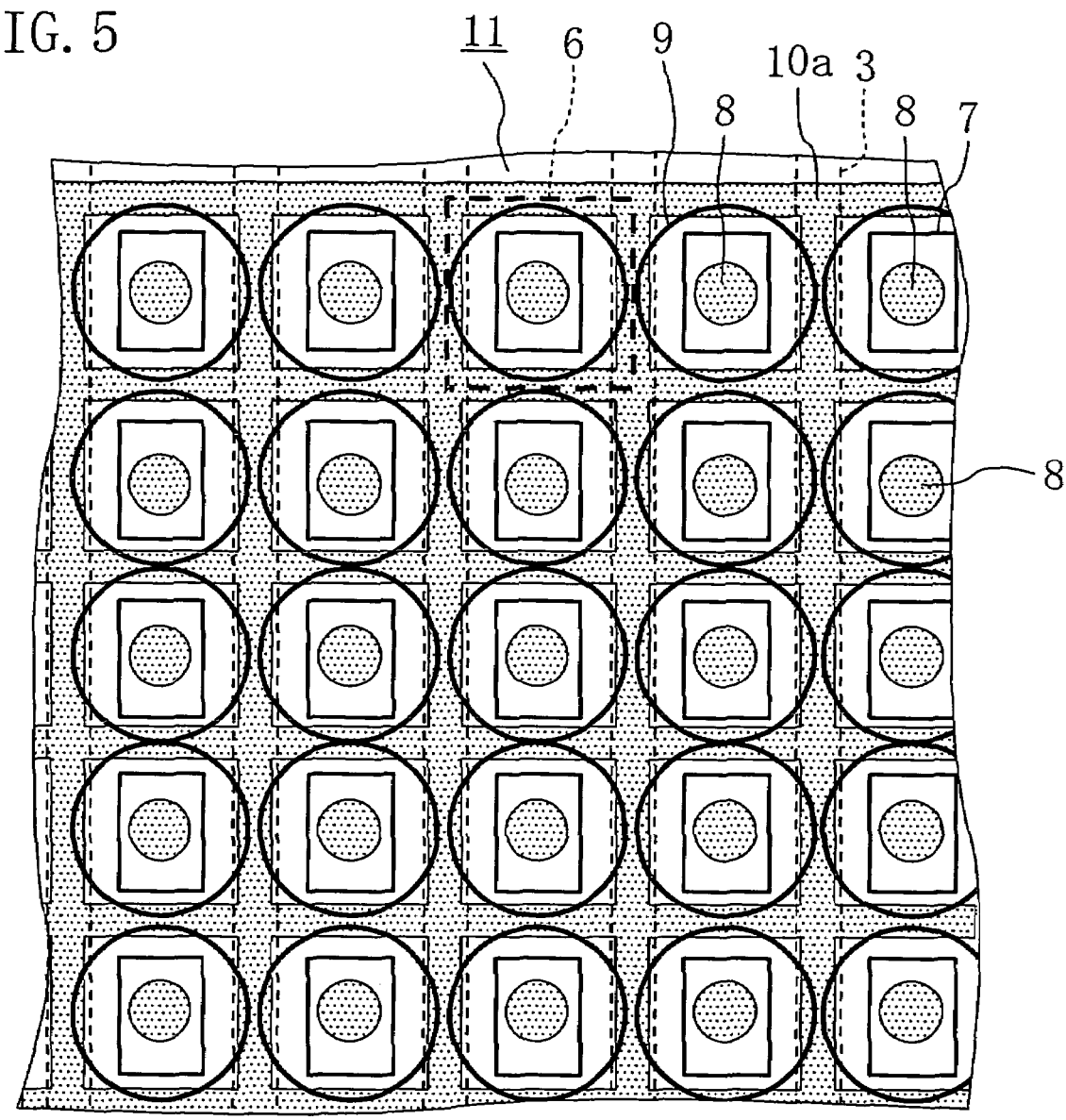
FIG. 5 is a plan view illustrating an optical waveguide in the form of a grid.
Figure 6:
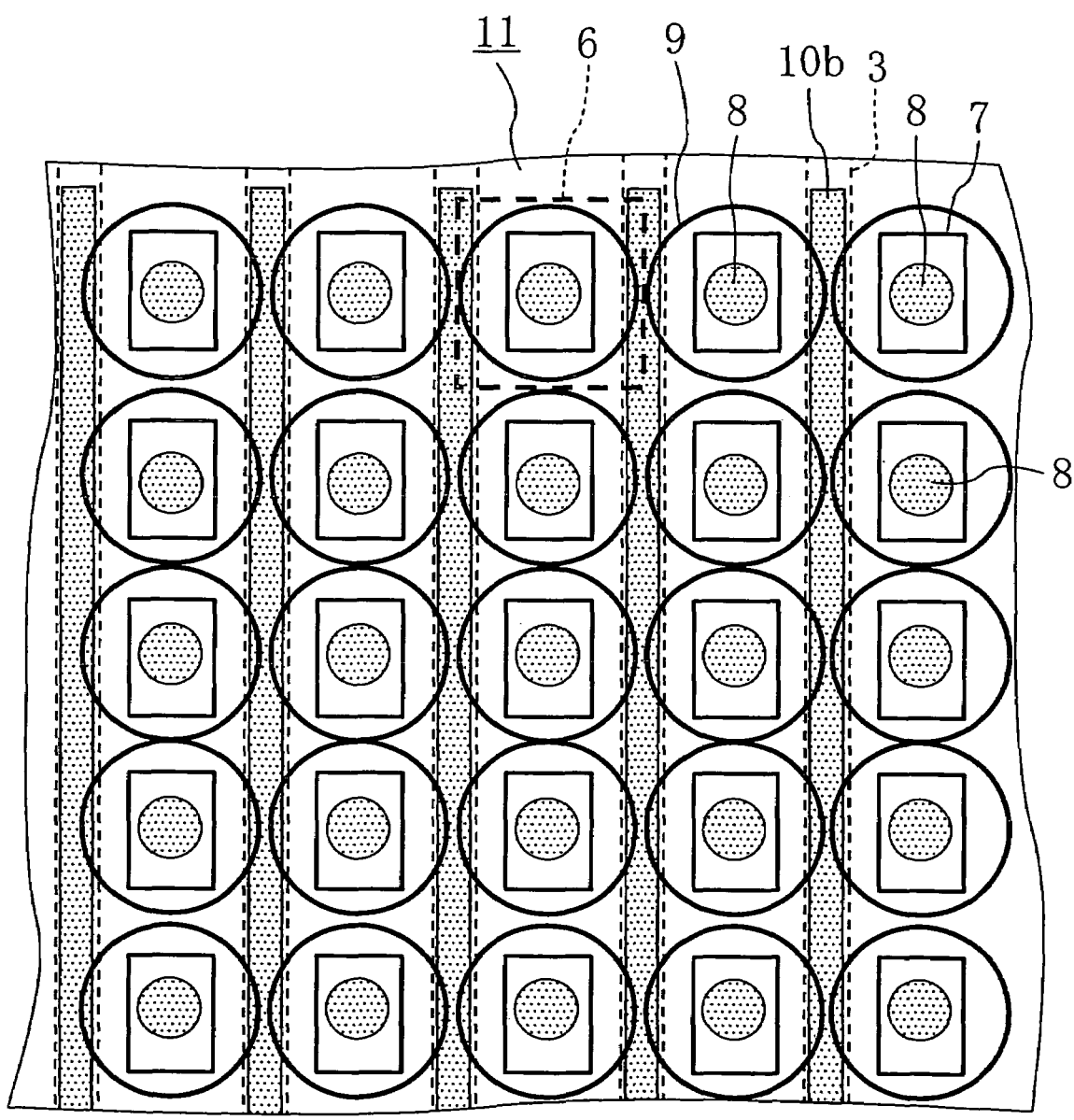
FIG. 6 is a plan view illustrating an optical waveguide in the form of stripes.

In the first and second embodiments described above, the second optical waveguides 10 are round-shaped when viewed in plan (FIG. 1). However, the planar shape of the optical waveguides is not particularly limited thereto. For example, as shown in FIG. 5, second optical waveguides 10a in the form of a grid when viewed in plan may be formed. Alternatively, second optical waveguides 10b in the form of stripes when viewed in plan may be formed as shown in FIG. 6. With these structures, oblique light as a cause of color mixing is gathered into the second optical waveguides 10a and 10b with high efficiency. Further, as the distance between the openings to be filled with the nitride film is reduced, the planarization of the nitride film formed by HDP-CVD is carried out more easily. As a result, flexibility in designing the solid state imaging device increases.

In the first and second embodiments, the first and second optical waveguides 8 and 10 are made of a nitride film. However, the material for the optical waveguides is not limited thereto. For example, any material may be used as long as it has a refractive index higher than that of a film present around the optical waveguides.

In the first and second embodiments, the gate electrodes are single-layered. However, the structure of the gate electrodes is not limited thereto. For example, the gate electrode may have a layered structure including a stack of a polysilicon film, a silicon oxide film and a polysilicon film.

In the solid state imaging device according to the first and second embodiments, the microlenses are provided in an arrangement corresponding to the photodiodes 15. However, two or more microlenses may be provided for a single photodiode 15.

What is claimed is:

1. A solid state imaging device including a plurality of light receiving elements arranged in a substrate such that a substrate region is defined between adjacent light receiving elements, the solid state image device comprising:
   first optical waveguides formed above the light receiving elements;
   second optical waveguides formed over the respective substrate regions; and
   condenser lenses provided in the same arrangement as the light receiving elements and the first optical waveguides when viewed in plan, wherein
   the second optical waveguides are positioned between the condenser lenses when viewed in plan.

2. The solid state imaging device of claim 1 further comprising light absorbers arranged below the second optical waveguides.

3. The solid state imaging device of claim 1, wherein the second optical waveguides are column-shaped.

4. The solid state imaging device of claim 1, wherein the second optical waveguides are in the form of a grid or stripes when viewed in plan.

5. The solid state imaging device of claim 1 further comprising:
   charge transfer portions formed in the substrate between the light receiving elements;
   a gate insulating film formed on the charge transfer portions;
   gate electrodes formed on the gate insulating film;
   a light shield film covering the gate electrodes and having openings positioned above the light receiving elements; and
   an insulating film covering the surface of the light shield film and the inside of the openings, wherein
   the first optical waveguides are formed in the openings and the second optical waveguides are formed above the light shield film.

* * * * *